US008467595B2

(12) United States Patent
Takahashi et al.

(10) Patent No.: US 8,467,595 B2
(45) Date of Patent: Jun. 18, 2013

(54) DEFECT REVIEW SYSTEM AND METHOD, AND PROGRAM

(75) Inventors: Noritsugu Takahashi, Kokubunji (JP); Muneyuki Fukuda, Kokubunji (JP); Tomoyasu Shojo, Saitama (JP); Naomasa Suzuki, Hitachinaka (JP); Kenji Obara, Kawasaki (JP)

(73) Assignee: Hitachi High-Technologies Corporation, Tokyo (JP)

( * ) Notice: Subject to any disclaimer, the term of this patent is extended or adjusted under 35 U.S.C. 154(b) by 199 days.

(21) Appl. No.: 13/056,353

(22) PCT Filed: Jul. 27, 2009

(86) PCT No.: PCT/JP2009/063336
§ 371 (c)(1),
(2), (4) Date: Feb. 9, 2011

(87) PCT Pub. No.: WO2010/013665
PCT Pub. Date: Feb. 4, 2010

(65) Prior Publication Data
US 2011/0129142 A1      Jun. 2, 2011

(30) Foreign Application Priority Data
Aug. 1, 2008   (JP) .................................. 2008-199804

(51) Int. Cl.
*G06K 9/00* (2006.01)
(52) U.S. Cl.
USPC .................... 382/149; 356/237.2; 382/144
(58) Field of Classification Search
USPC ................................................. 382/144, 149
See application file for complete search history.

(56) References Cited

U.S. PATENT DOCUMENTS

| 5,963,314 | A  | * | 10/1999 | Worster et al. ............. 356/237.2 |
| 6,259,960 | B1 | * | 7/2001  | Inokuchi ....................... 700/110 |
| 6,559,457 | B1 | * | 5/2003  | Phan et al. ................. 250/491.1 |
| 6,653,631 | B2 | * | 11/2003 | Nishimura ........................ 850/1 |
| 7,260,256 | B2 | * | 8/2007  | Hiroi et al. .................... 382/141 |
| 7,428,850 | B2 | * | 9/2008  | Naftali et al. ................ 73/865.8 |
| 7,653,236 | B2 | * | 1/2010  | Takahashi ..................... 382/145 |
| 8,041,103 | B2 | * | 10/2011 | Kulkarni et al. .............. 382/144 |
| 2002/0126888 | A1 | * | 9/2002  | Vacca et al. ................... 382/145 |
| 2004/0042648 | A1 | * | 3/2004  | Yoshidda et al. ............. 382/151 |
| 2005/0146714 | A1 | * | 7/2005  | Kitamura et al. .......... 356/237.2 |

(Continued)

FOREIGN PATENT DOCUMENTS

| JP | 2003-133379 A | 5/2003 |
| JP | 2005-283326 A | 10/2005 |

(Continued)

*Primary Examiner* — Gregory M Desire
(74) *Attorney, Agent, or Firm* — Mattingly & Malur, PC

(57) ABSTRACT

A system is provided that realizes both reduction in coordinate error and improvement in throughput and allows observation of a micro-defect. The system includes: a function of measuring an amount of displacement between preliminarily calculated coordinates and an actual specimen position; a function of optimizing a coordinate correction formula so as to minimize the amount of displacement from the measured amount of displacement; and a function of calculating variation of displacement between the preliminarily calculated coordinates and the actual specimen position by statistical processing. When a value of coordinate variation is sufficiently small with respect to the field of view of an image for observation, which is to be a defect observation image, the system acquires only the image for observation without performing acquisition of an image for search, which is to be a defect search image.

5 Claims, 5 Drawing Sheets

U.S. PATENT DOCUMENTS

| | | |
|---|---|---|
| 2006/0104500 A1 | 5/2006 | Obara et al. |
| 2007/0024963 A1 | 2/2007 | Maedo et al. |
| 2007/0276620 A1 | 11/2007 | Hirai et al. |
| 2008/0270044 A1 | 10/2008 | Hirai et al. |
| 2009/0212213 A1* | 8/2009 | Nakasuji et al. ............. 250/310 |
| 2011/0129141 A1* | 6/2011 | Hiroi et al. ................... 382/149 |

FOREIGN PATENT DOCUMENTS

| | | |
|---|---|---|
| JP | 2006-145269 A | 6/2006 |
| JP | 2007-19270 A | 1/2007 |
| JP | 2007-317508 A | 12/2007 |

* cited by examiner

# DEFECT REVIEW SYSTEM AND METHOD, AND PROGRAM

TECHNICAL FIELD

The present invention relates to a defect review system, method and program, and for example, relates to a process of measuring dimensions and a shape of a circuit pattern formed on a semiconductor wafer or to an inspecting process.

BACKGROUND ART

A process of inspecting a shape of a circuit pattern formed on a semiconductor wafer, for foreign matter and the like in a process of manufacturing a semiconductor device plays an important role in improving yields and establishing reliability. In the aforementioned process of inspecting, the inspecting is performed mainly by an inspection system utilizing light.

In particular, as semiconductor devices have become finer in recent years, it is difficult to observe the details of a defect only by the aforementioned inspecting. Accordingly, a defect review system, which magnifies and observes the defect found in the inspecting, is important. The defect review system is an apparatus for acquiring an image of a region including each defect on the basis of position information of the defect on a semiconductor wafer detected by another inspection system, such as a defect inspection system.

The defect review system is required to observe a defect with a size equal to or smaller than that of a process node. Accordingly, a charged particle microscope, which utilizes charged particle beams such as electron beams and provides nanometer-level resolution, is mainly used. However, the defect review system employing the charged particle microscope has a throughput lower than that of an inspection system utilizing light. Thus, it is important to increase the throughput of the defect review system for the sake of improving inspection efficiency.

One of the factors reducing the throughput may be coordinate accuracy of an observation position. The defect review system employing the charged particle microscope acquires an image at a defect position and an image (reference image) to be acquired if the defect does not exist at low magnification with a wide field of view for the sake of identifying the defect position, compares the images with each other and identifies the defect position, and subsequently acquires a defect image for observation at high magnification where the defect is enlarged and displayed.

Here, referring to FIG. 1, an operation of a typical defect review system is briefly described. First, based on an image acquisition preparatory sequence 121 and setting of an image acquisition condition setting 122, a sequence 123 of acquiring a reference image for search and a sequence 124 of acquiring a defect image for search are performed. Then, according to a defect position extraction 125, a sequence 126 of acquiring a defect image for observation acquires a defect image at an appropriate position. Subsequently, the sequences 123, 124 and 125 are performed until the defect review is completed. An acquisition condition used in the image acquisition condition setting 122 has been preset in a recipe to be read in the image acquisition preparatory sequence 121. The setting condition of an acquisition image is not changed in the middle of review.

In a case of a poor coordinate accuracy, a defect cannot accurately be included in a narrow and high magnification field of view. In order to avoid that, it is required to search a relatively wide field of view at low magnification for a defect. Accordingly, if acquisition of an image for search is set, the acquisition of an image for search is performed even on a defect that is originally acquirable in a narrow field of view with high magnification. This leads to reduction in throughput. Accordingly, it is important to improve the coordinate accuracy.

Among techniques improving coordinate accuracy and throughput, for example in Patent Literature 1, a technique is disclosed that absorbs a coordinate error by position alignment between design data of a semiconductor integrated circuit and an image at a reference position, and thereby acquires an image for observation without acquiring any image for search and improves the throughput. Further, in Patent Literature 2, a technique is disclosed that removes a coordinate error owing to a coordinate offset between system, subsequently calculates variation in inspection by statistical processing and determines a magnification of an image for search using calculated data.

CITATION LIST

Patent Literature

Patent Literature 1: JP Patent Publication (Kokai) No. 2005-283326A (2005)
Patent Literature 2: JP Patent Publication (Kokai) No. 2006-145269A (2006)

SUMMARY OF INVENTION

Technical Problem

In Patent Literature 1, design data of a semiconductor integrated circuit is used in order to absorb a coordinate error. More specifically, an image with a normal pattern is created in a simulated manner from CAD data where the design data is written, the created image and an actually acquired image are compared with each other, and a displacement between coordinates are calculated and corrected.

This technique is capable of correcting the displacement between the coordinates included in the circuit pattern and the defect review system. However, this technique is incapable of correcting a coordinate displacement caused owing to a defect inspection system in an inspection step.

In Patent Literature 2, a value calculated by statistical processing is fed back, as a value of coordinate variation, to determination of magnification of an image for search, and accurately realizes inspection.

However, this technique is incapable of improving throughput. Further, according to this technique, in a case of low magnification of an image for search determined by this technique, it is difficult to observe a micro-defect.

The present invention is made in view of these situations. It is an object of the present invention to provide a system that realizes both reduction in coordinate error and improvement in throughput, and allows observation of micro-defects.

Solution to Problem

In order to solve the above problems, a defect review system according to the present invention is a defect review system moving a specimen to a coordinate position of a defect detected in a first coordinate system and observing the defect of the specimen in a narrow field of view with respect to a second coordinate system, including: a displacement measurement section which measures an amount of displacement between the coordinate position of the defect in the first coordinate system and an actual specimen position in the second coordinate system; a coordinate correction formula optimizer which optimizes a coordinate correction formula for performing conversion from the second coordinate system to the first coordinate system in a direction of minimizing the measured amount of displacement; a variation amount calculator which performs statistical processing on a variation amount of the amount of displacement between the first coordinate system and the second coordinate system; a variation amount evaluation section which evaluates the variation amount on the basis of the length of the narrow field of view; and a sequence determining section which determines a sequence of a process of acquiring a defect image on the basis of an evaluation result by the variation amount evaluation section. Here, the displacement measurement section, the coordinate correction formula optimizer, the variation amount calculator, the variation amount evaluation section, and the sequence determining section can be realized as, for example, specific functions of a computing system 4 in FIG. 2. However, units performing the respective functions may be configured.

For example, when the variation amount is smaller than a certain constant-fold product of the length of the narrow field of view, the sequence determining section determines the sequence of the process of acquiring the defect image so as to skip the process of acquiring an image for search for detecting the defect in a wide field of view and to perform a process of acquiring a defect image for observation in the narrow field of view. On the other hand, when the variation amount is larger than a certain constant-fold product of the length of the narrow field of view, the sequence determining section determines the sequence of the process of acquiring the defect image so as to perform a process of acquiring an image for search for detecting the defect in a wide field of view and to perform a process of acquiring, using a result thereof, a defect image for observation in the narrow field of view.

The system further includes a variation amount updating section which extracts a defect position using the defect image for search acquired in the process of acquiring an image for search, reflects the defect position in the variation amount acquired by the variation amount calculator and thereby updates the variation amount. In this case, the sequence determining section determines the sequence of the process of acquiring the defect image using the updated variation amount acquired by the variation amount updating section. When the amount of displacement deviates by at least a prescribed extent from the variation amount, the variation amount updating section prohibits updating of the variation amount. That is, a largely deviating amount of displacement is not reflected in the variation amount updating.

Further features of the present invention will hereinafter become apparent according to the best mode for carrying out the present invention and accompanying drawings.

Advantageous Effects of Invention

The present invention realizes both reduction in coordinate error and improvement in throughput, and allows observation of micro-defects with high throughput.

DESCRIPTION OF EMBODIMENTS

Embodiments of the present invention will hereinafter be described with reference to accompanying drawings. However, these embodiments are only examples for implementing the present invention, and do not limit the technical scope of the present invention. It should be noted that any modification and change may be made without departing from the spirit of the present invention.

(1) First Embodiment

A defect review system according to a first embodiment performs a process of determining whether there is a necessity for acquiring an image for search on the basis of a pre-measured value of coordinate variation.

<Configuration of Defect Review System>

Figure 1:
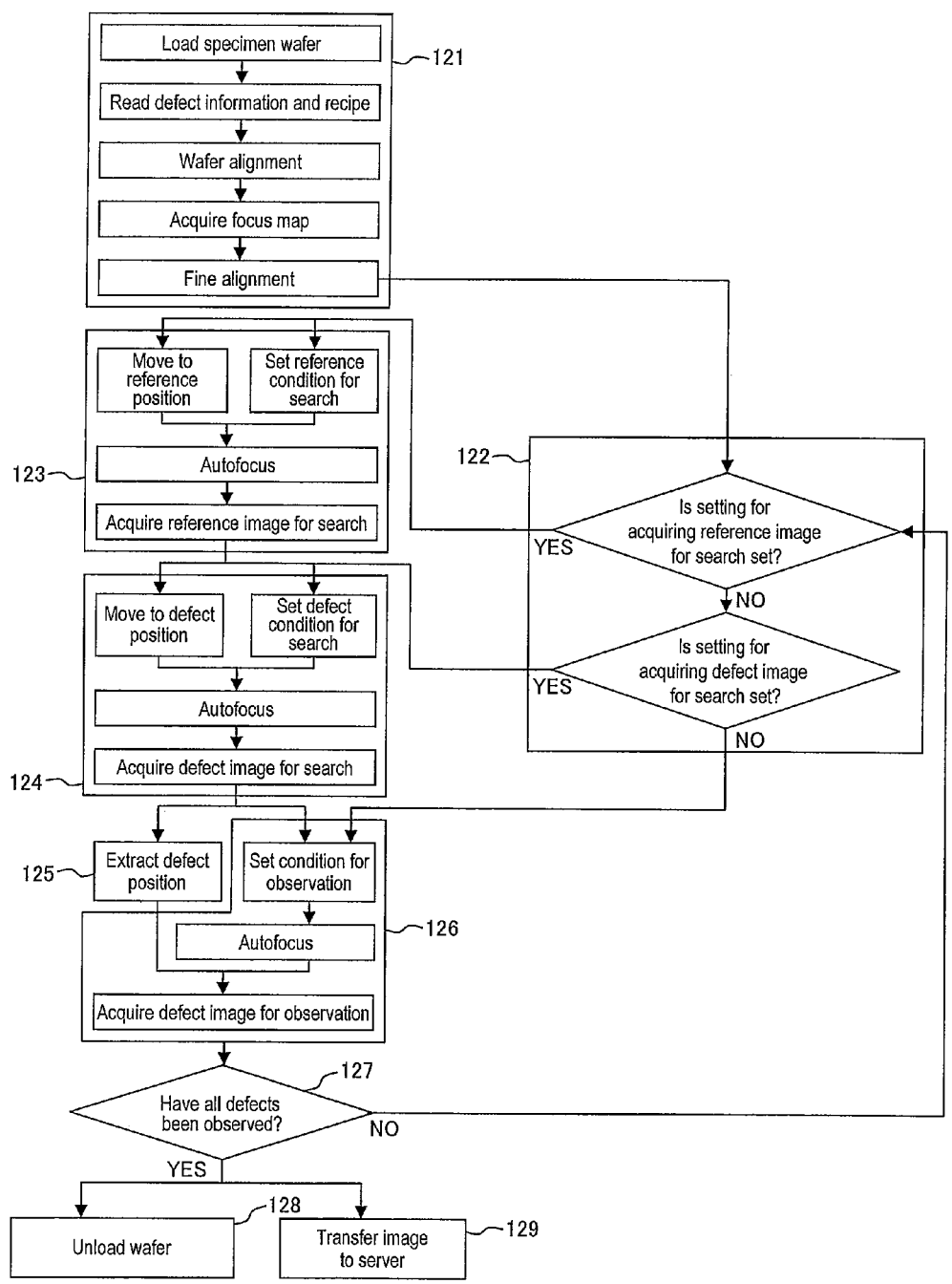
FIG. 1 is a flowchart for illustrating an operation of a typical defect review system.
Figure 2:
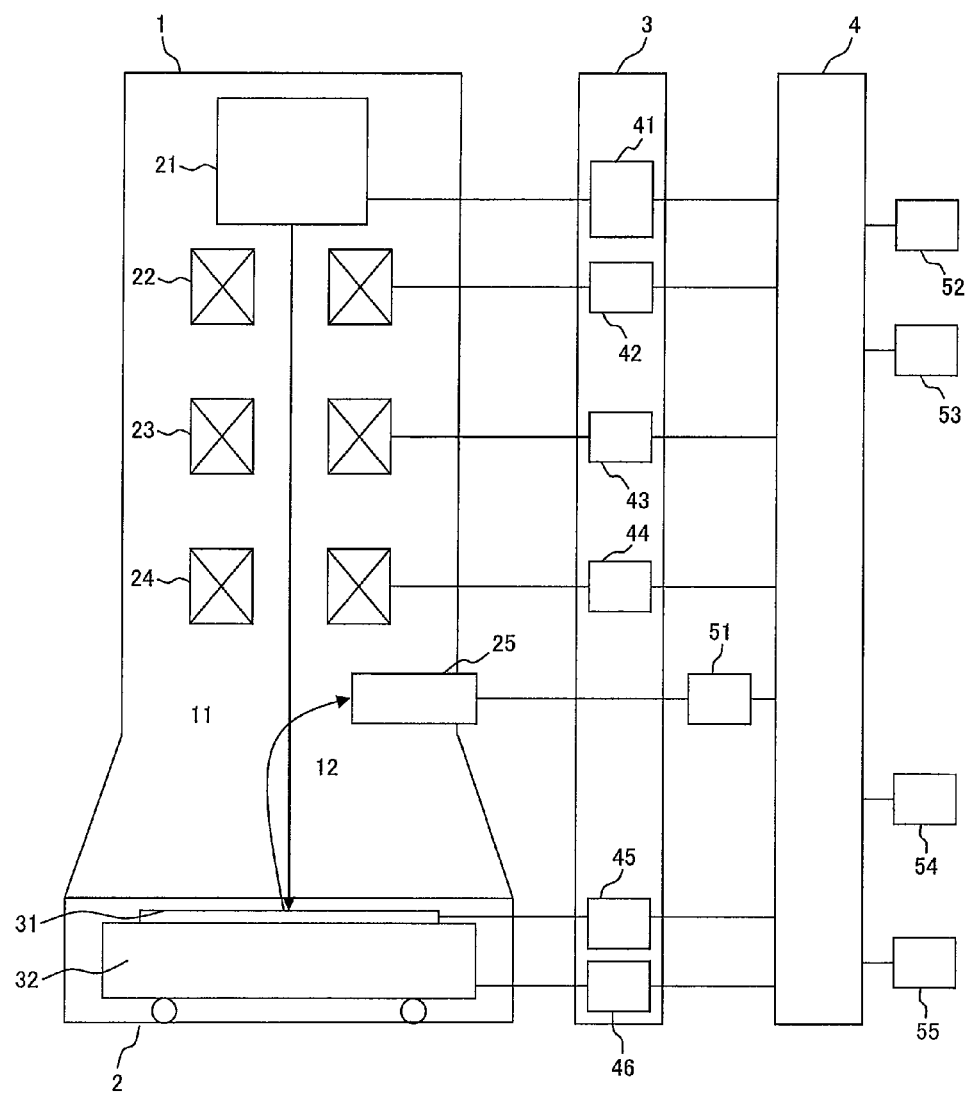
FIG. 2 is a diagram showing a schematic configuration of a defect review system according to the present invention.

FIG. 2 is a diagram showing a schematic configuration of a defect review system according to this embodiment. As shown in FIG. 2, the defect review system includes: a scanning electron microscope including an electron beam column 1 and a specimen chamber 2; a power source unit 3 for supplying various types of operation voltages and drive currents in the electron beam column 1; a computing system 4 for performing overall control of the entire system; an image display 52 accompanying the computing system 4; an input device 53, such as a keyboard and a mouse; a transceiver 54 for communication of coordinate information, image information and the like with an external system; and an information storage 55 for storing defect position information and an acquired image.

The power source unit 3, which is an aggregation of control power sources for elements of the electron beam column 1 and a specimen stage 32, includes: a high voltage control power source 41; a focusing lens control power source 42; a deflector lens control power source 43; an objective lens control power source 44; a specimen voltage control power source 45 for applying a voltage to a specimen 31; and a stage driving power source 46 for driving the specimen stage 32.

A primary electron beam 11 derived from an electron source 21 controlled by the high voltage control power source 41 is converged by a focusing lens 22 controlled by the focusing lens control power source 42. The electron beam is deflected by a deflector lens 23 controlled by the deflector lens control power source 43 so as to two-dimensionally scan on the specimen, and focused on the specimen 31 as a microspot by an objective lens 24 controlled by the objective lens control power source 44. In FIG. 2, a configuration is adopted where the objective lens is arranged nearer to the specimen than the deflector lens. However, another configuration may be adopted where the deflector lens is arranged nearer to the specimen than the objective lens instead.

When a negative voltage controlled by the specimen voltage control power source 45 is applied to the specimen 31, the primary electron beam 11 is decelerated and irradiated onto the specimen 31. The power source unit 3, which includes all of the aforementioned power sources, can be controlled according to an indication by the computing system 4.

A secondary signal 12, such as reflected electrons and secondary electrons, generated at the specimen 31 by the irradiation of the primary electron beam 11 is detected by a secondary signal detector 25, and transferred as pixel information to an image forming system 51. The image formed by the image forming system 51 is stored as digital data in the information storage 55.

The specimen stage 32 is capable of independently moving the specimen 31 at least in two directions in a plane perpendicular to the incident direction of the primary electron beam. The specimen stage 32 is capable of reading, via the transceiver 54, coordinates described in the defect position information stored in the information storage 55 or coordinates input from the input device 53, and of moving the specimen 31 to the coordinates according to an indication of the computing system 4.

<Processing Operation of Defect Review System>

Figure 3:
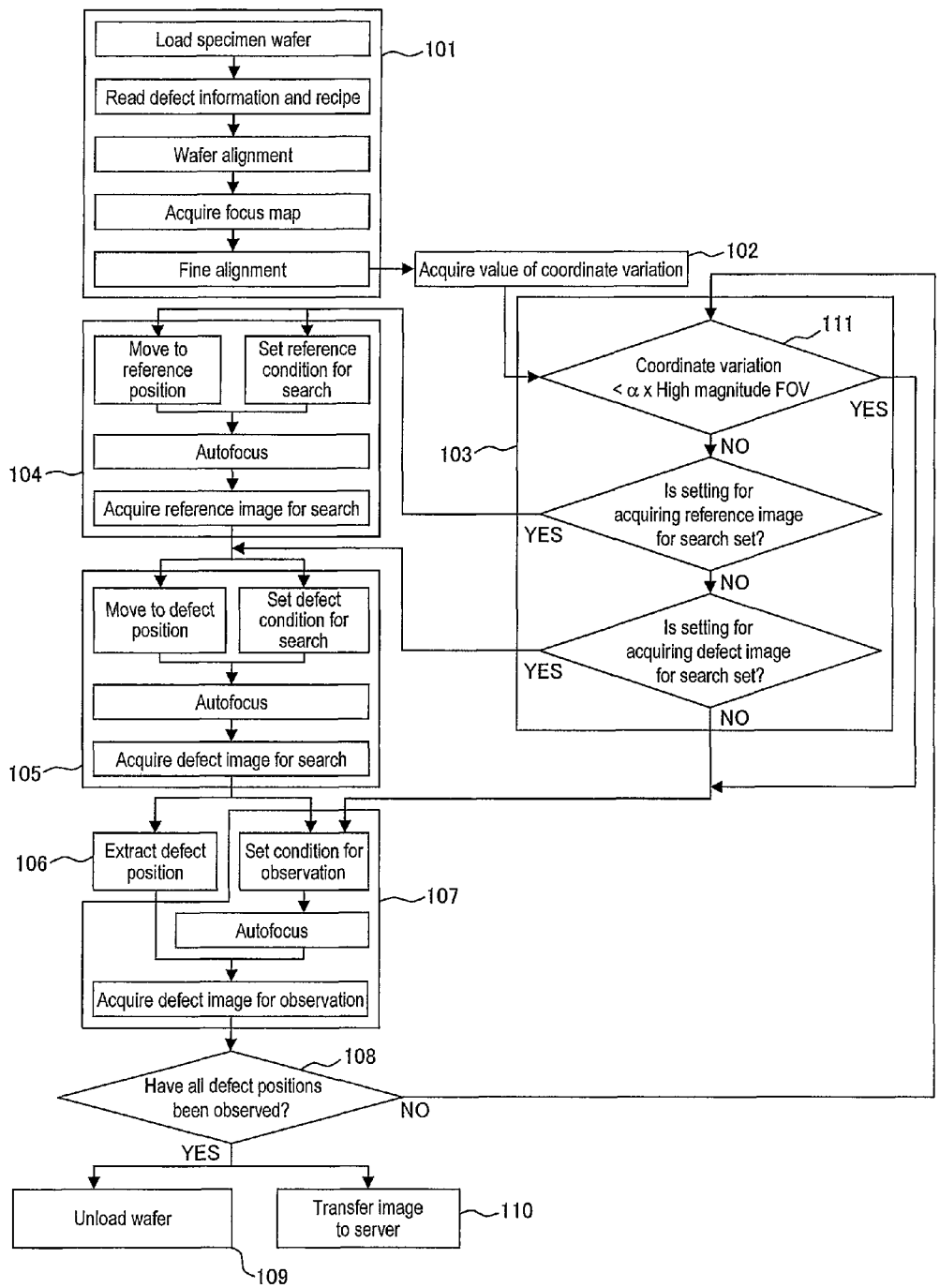
FIG. 3 is a flowchart for illustrating a processing operation of a defect review system according to a first embodiment of the present invention.

FIG. 3 is a flowchart for illustrating the entire processing operation of the defect review system according to the first embodiment.

First, the computing system 4 performs an image acquisition preparatory sequence 101. More specifically, when a wafer is transferred onto the specimen stage 32 in the specimen chamber 2 (process of loading a specimen wafer: for example, the computing system 4 detects that the wafer is loaded by a user, or the wafer is automatically loaded under control of the computing system 4), the computing system 4 reads from the information storage 55 coordinate information of defect positions on the wafer detected by the defect inspection system, and a recipe including descriptions of a system operating condition for automatically acquiring an image and chip coordinates acquired from arrangement of chips formed on the wafer (process of reading defect information and the recipe). Further, the computing system 4 determines correspondence between a stage coordinate system included in the defect review system and a chip coordinate system (wafer alignment process). Moreover, the computing system 4 measures a focusing condition of the objective lens 24 with respect to a specified wafer position, and calculates a focusing value at an arbitrary position on the wafer using the measured value (process of acquiring a focus map). The computing system 4 corrects the correspondence between the stage coordinate system included in the defect review system and the chip coordinate system such that the defect is disposed at the center of an image acquired by movement to the coordinates of the defect position read from the information storage 55 (fine alignment process).

Among coordinate correction formulas used in the fine alignment process, for example, the following formula using parameters a, b, m and n can be employed for correction in a case where coordinate error factors are an origin offset (a, b) and dimension accuracy error m and n of X and Y axes.

[Expression 1]

$$\begin{pmatrix} x_2 \\ y_2 \end{pmatrix} = \begin{pmatrix} mx_1 + a \\ ny_1 + b \end{pmatrix} \quad \text{(Formula 1)}$$

where (x1, y1) are coordinates of the defect position detected by the defect inspection system, and (x2, y2) are coordinates described in the chip coordinate system converted so as to be adapted to the coordinate system of the defect review system.

Instead, the following formula where the origin offset (a, b) and pitch correction coefficients c11, c12, c21 and c22 are adopted as parameters may be used as the coordinate correction formula.

[Expression 2]

$$\begin{pmatrix} x_2 \\ y_2 \end{pmatrix} = \begin{pmatrix} c_{11} & c_{12} \\ c_{21} & c_{22} \end{pmatrix} \begin{pmatrix} x_1 \\ y_1 \end{pmatrix} + \begin{pmatrix} a \\ b \end{pmatrix} \quad \text{(Formula 2)}$$

In Formula 2, in a case where a turn is the coordinate error factor, c11, c12, c21 and c22 are represented as $\cos\theta$, $-\sin\theta$, $\sin\theta$, $\cos\theta$, respectively, using an angle $\theta$ of rotation. A correction according to a correction formula different from the aforementioned Formulas 1 and 2, such as for example a higher-order correction formula, may be employed. A system capable of selecting and using a correction formula may be adopted. Parameters are determined so as to match with these formulae with high precision, according to the least squares method. The parameters are stored in the information storage 55.

After completion of the sequence 101, the computing system 4 performs a sequence 102 of acquiring a value of coordinate variation, and the variation of correction values is represented in a numerical form. Here, it is identified how much displacement is caused by applying an amount of correction calculated by the fine alignment to defects of another die, and a process of calculating the variation of the amount of displacement is performed. The variation of correction values can be calculated according to the following procedures. A correction vector ($\Delta$x, $\Delta$y) is calculated according to Formula 3 using the coordinates (x1, y1) of the defect position detected by the defect inspection system and the coordinates (x2, y2) described in the chip coordinate system converted so as to be adapted to the coordinate system of the defect review system.

[Expression 3]

$$(\Delta x, \Delta y) = (x2-x1, y2-y1) \quad \text{(Formula 3)}$$

where $\Delta$x and $\Delta$y may employ (x2, y2) calculated by randomly providing (x1, y1) and using the aforementioned correction formulae. Instead, actual (x1, y1) and (x2, y2) used for the correction in the fine alignment process may be employed. Statistical processing is performed on each element of the calculated ($\Delta$x, $\Delta$y), and the variation of data is calculated. For example, provided that a statistical distribution of ($\Delta$x, $\Delta$y) is a normal distribution, a variance $\sigma$ is calculated. The greater one of widths of $\Delta$x and $\Delta$y, which is regarded to include at least 99% of data (corresponding to $6\sigma$, in this case), is specified as the variation; the value of coordinate variation is stored in the information storage 55. The statistical distribution to be used is not limited to the normal distribution but may be a statistical distribution function that reproduces the distribution.

Next, the computing system 4 performs a sequence 103 of determining an image acquisition condition. Here, the computing system 4 first performs a sequence 111 of determining skip of an image for search, and determines whether or not Formula 4 is satisfied between the coordinate variation acquired in the sequence 102 and a high-magnification field of view (FOV) set in the recipe.

[Expression 4]

(Coordinate Variation)<$\Delta$×(High Magnification Field of View) (Formula 4)

where α is a coefficient for determining the likelihood of the determination, into which a positive real number equal to or less than one is input. The α is a coefficient determined according to the size of a defect. The size of a defect can be identified by the optical inspection system to a certain extent. Accordingly, based thereon, an α according to which an entire defect is included in the field of view (α×FOV) is selected. There is a relationship where the larger the defect, the smaller the α becomes. The α may automatically be set appropriately, or manually be set small.

In a case where the relationship between the value of coordinate variation and the high-magnification FOV satisfies Formula 4, the computing system 4 performs a process 107 of acquiring a defect image for observation without performing a process 104 of acquiring a reference image for search and a process of acquiring a defect image for search. In the process 107 of acquiring a defect image for observation, the computing system 4 moves the stage to the defect position coordinates and subsequently sets a range of scanning the primary electron beam deflected by the deflector lens to the high-magnification FOV. Further, the computing system 4 performs focus control. The secondary signal detector then detects secondary electrons and reflected electrons generated at the specimen irradiated with the electron beam. The image forming system acquires the defect image for observation on the basis of the detected information.

On the other hand, in a case where the relationship between the value of coordinate variation and the high-magnification FOV does not satisfy Formula 4, if the recipe set via a GUI (see FIG. 4) has a setting for acquiring a reference image for search, the computing system 4 performs the sequence 104 of acquiring a reference image for search and the sequence 105 of acquiring a defect image for search. Subsequently, the computing system 4 performs a sequence 106 of extracting a defect position and the sequence 107 of acquiring a defect image for observation. More specifically, in the sequence 104 of acquiring a reference image for search, the computing system 4 moves the stage to the reference position coordinates, subsequently sets the range of scanning the primary electron beam deflected by the deflector lens to a low-magnification FOV and adjusts the focus. The secondary signal detector then detects the secondary electrons and reflected electrons generated at the specimen irradiated with the electron beam. The image forming system acquires a reference image for search on the basis of the detected information. In the sequence 105 of acquiring a defect image for search, the computing system 4 moves the stage to the defect position coordinates, subsequently sets the range of scanning the primary electron beam deflected by the deflector lens in the low-magnification FOV and adjusts the focus. The secondary signal detector then detects the secondary electrons and reflected electrons generated at the specimen irradiated with the electron beam. The image forming system acquires the defect image for search on the basis of the detected information. Further, in the sequence 106 of extracting a defect position, the computing system 4 forms a difference image between the reference image and the defect image acquired in the sequence 104 of acquiring a reference image for search and the sequence 105 of acquiring a defect image for search, respectively. The region with large difference in the difference image is extracted as a defect position. Further, the computing system 4 performs the sequence 107 of acquiring a defect image for observation together with extraction of the defect position. Here, the computing system 4 sets the range of scanning the primary electron beam deflected by the deflector lens to the high-magnification FOV, and performs operation of adjusting the focus. After completion of the extraction of the defect position, the computing system 4 sets the defect position at the center of the scanning region on the basis of the acquired result. The secondary signal detector then detects the secondary electrons and reflected electrons generated at the specimen irradiated with the electron beam. The image forming system acquires a defect image for observation on the basis of the detected information.

In a case where the set recipe does not have the setting for acquiring a reference image for search, the computing system 4 determines whether the set recipe has the setting for acquiring a defect image for search or not. If the recipe has the setting for acquiring, the computing system 4 performs the sequence 105 of acquiring a defect image for search, the sequence 106 of extracting a defect position, and the sequence 107 of acquiring a defect image for observation. Here, the reference image to be compared with the defect image in the sequence of extracting a defect position may be any image, provided that the image is not an image acquired in the sequence 104 of acquiring a reference image for search, such as an image preliminarily registered as the reference image, a reference image formed by detecting periodicity in the defect image for search, and a reference image formed from design data of the circuit pattern at the defect position.

In a case where the set recipe does not have the setting for acquiring a defect image for search either, the computing system 4 performs the sequence 107 of acquiring a defect image for observation as it is.

After performance of the sequence 107 of acquiring a defect image for observation, the computing system 4 performs a sequence 108 of determining whether all defect positions have been observed or not. If it is determined that all defect positions have been observed, the computing system 4 transfers the wafer from the specimen stage 32 in the specimen chamber 2 (sequence 109 of unloading a wafer), and transfers the defect image acquired in the sequence 107 of acquiring a defect image for observation to an external server (sequence 110 of transferring an acquired image to the server). With the above sequences, the series of sequences are completed. Note that in the sequence 110 of transferring an acquired image to the server, there is a case where the image acquired in the sequence 105 of acquiring a defect image for search is transferred to the external server together with the aforementioned defect image. On the other hand, if the computing system 4 determines that observation spots of the defect positions have still remained in the sequence 108 of determining, the computing system 4 performs the sequence 103 of determining the image acquisition condition again until satisfying the aforementioned sequence 108 of determining <Example of GUI>

Figure 4:
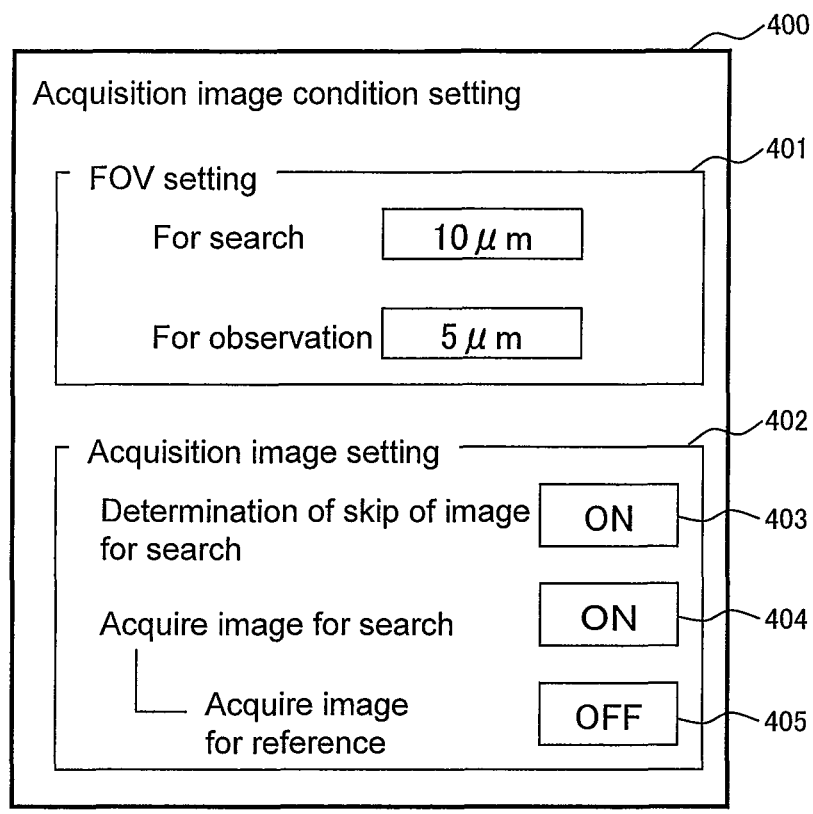
FIG. 4 is a diagram showing an example of a configuration of GUI used in the defect review system of the present invention.

The defect review system according to the first embodiment preliminarily sets the recipe where an image acquisition condition is described, before the review. FIG. 4 shows an example of a configuration of a GUI screen 400 for setting a recipe. The GUI 400 includes, for example, a FOV setting section 401 and an acquisition image setting section 402. The acquisition image setting section 402 includes, for example, a section 403 of determining skip of an image for search, a section 404 of setting acquisition of an image for search, and section 405 of setting reference image acquisition.

The size of the FOV is determined according to a numerical value input from the FOV setting section 401. Further, the section 403 of setting skip of image for search determines whether to perform the sequence 111 of determining skip of an image for search or not. More specifically, in a case of ON, a process 111 of skipping an image for search of the present invention is performed. In a case of OFF, the conventional process of defect review system is performed. Irrespective of the content of the skip setting of an image for search, the FOV of the image for search, the FOV of the image for observation, whether the image for search corresponding to the defect image for search is to be acquired or not, and whether the reference image for search is to be acquired or not, are selectable.

FIG. 4 shows the configuration where these are arranged on the same GUI. However, these are not necessarily arranged on the same GUI, and may be arranged on separate GUIs where possible.

As described above, this embodiment realizes high throughput observation without missing the defect to be observed from the field of view, in a case where the coordinate variation owing to the defect inspection system is small.

(2) Second Embodiment

A defect review system according to a second embodiment performs a process of determining whether there is a necessity for acquiring an image for search while updating the value of coordinate variation together with acquiring a defect image. A configuration of the system and a GUI are the same as those of the first embodiment. Accordingly, the description thereof is omitted.

<Processing Operation of Defect Review System>

Figure 5:
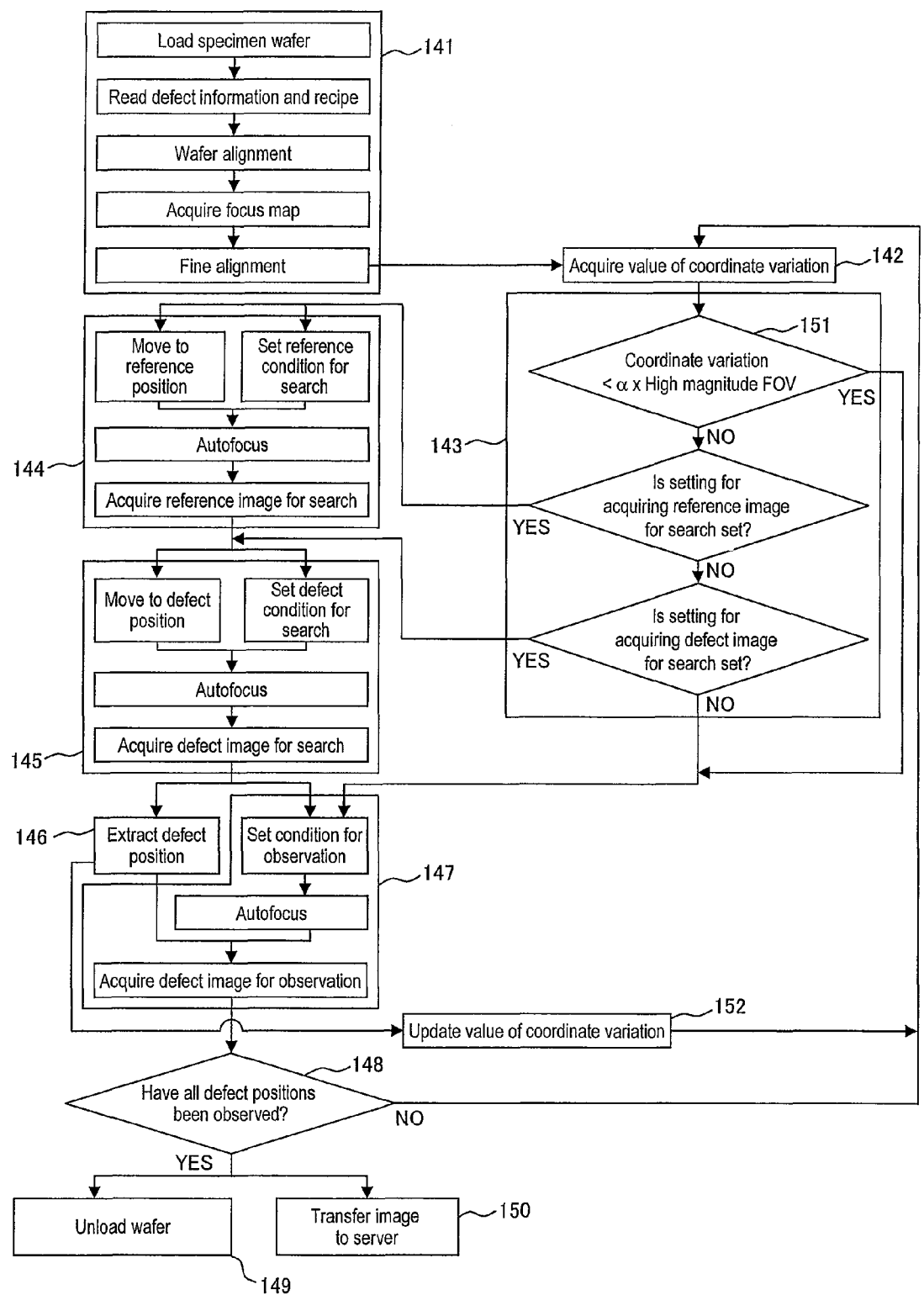
FIG. 5 is a flowchart for illustrating a processing operation of a defect review system according to a second embodiment of the present invention.

FIG. 5 is a flowchart for illustrating an overall processing operation of the defect review system according to the second embodiment.

The respective operations of an image acquisition preparatory sequence 141, a sequence 142 of acquiring a value of coordinate variation, a sequence 143 of determining an image acquisition condition, a sequence 144 of acquiring a reference image for search, a sequence 145 of acquiring a defect image for search, a sequence 146 of extracting a defect position, a sequence 147 of acquiring a defect image for observation, a sequence 148 of determining whether all defect positions have been observed or not, a wafer unloading sequence 149, a sequence 150 of transmitting the acquired image to the server, and a sequence 151 of determining skip of an image for search are the same as those illustrated in the first embodiment. Accordingly, the descriptions thereof are omitted.

In a case where a recipe has a setting of acquiring a defect image for search, after completion of performing the sequence 145 of acquiring a defect image for search, the computing system 4 performs a sequence 152 of updating the value of coordinate variation on the defect position detected in the sequence 146 of extracting a defect position. Provided that displacements in X and Y directions from the acquired center of the image are e and f, respectively, corrections at the defect position are represented according to the following Formula 5.

[Expression 5]

$$(x3, y3) = (x2+e, y2+f) \quad \text{(Formula 5)}$$

where (x2, y2) are coordinates described in a chip coordinate system converted so as to be adapted to a coordinate system of the defect review system in a fine alignment process. (x3, y3) are the coordinates determined as the defect position in the sequence 146 of extracting a defect position. With respect to (x3, y3) calculated according to Formula 5, a correction vector (Δxn, Δyn) is newly calculated according to the following Formula 6.

[Expression 6]

$$(\Delta xn, \Delta yn) = (x3-x1, y3-y1) \quad \text{(Formula 6)}$$

In the sequence 152 of updating the value of coordinate variation, the value of coordinate variation, having been acquired in the sequence 142 of acquiring a value of coordinate variation and stored in an information storage 55, is recalculated using Δxn and Δyn calculated according to Formula 6. For example, in a case of calculating the value of coordinate variation on the basis of a sample variance, the recalculation is made according to a following Formula 7.

[Expression 7]

$$\sigma^2 = \frac{1}{n}\sum_{i=1}^{n}(A - Ai)^2 \quad \text{(Formula 7)}$$

where σ is a variance, the coordinate variation corresponds to 6σ, n is the number of acquired pieces of data, A is an arithmetic mean of the acquired pieces of data, and Ai is the value of the acquired pieces of data, or Δxn and Δyn.

If the computing system 4 determines that an observation spot has still remained in the sequence 148 of determining whether all defect positions have been observed or not, the computing system 4 newly acquires an updated value of coordinate variation, and performs the sequence 143 of determining an image acquisition condition again. Here, in a case where the updated value of variation newly satisfies a determination condition of the process 151 of determining skip of an image for search, the process of acquiring an image for search is skipped, and the processing proceeds to the sequence 147.

By the way, in the sequence 152 of updating the value of variation, in a case where a correction vector (Δxn, Δyn) suddenly deviates by a large amount from the value of coordinate variation before updating, processing is made as will be described below. More specifically, here, measures against a case where a trend of the defect coordinates acquired from a defect inspection system has suddenly been changed owing to the defect inspection system or the defect review system will be described.

It is determined whether the coordinate variation before updating has suddenly deviated by a large amount or not with respect to the correction vector (Δxn, Δyn), according to whether the computing system 4 satisfies Formula 8 or not.

[Expression 8]

$$(\text{Coordinate Variation}) < \beta \times (\Delta xn^2 + \Delta yn^2)^{1/2} \quad \text{(Formula 8)}$$

where the coordinate variation can be acquired according to the aforementioned Formula 7. β is a coefficient representing a variation allowance. In a case where Formula 8 is satisfied, the computing system 4 determines that a large displacement has suddenly occurred, and stores the acquired value of the correction vector in the information storage 55 without updating the value of coordinate variation. Next, in a case where the correction vector newly acquired by performing the sequence 146 of extracting a defect position is converged within the coordinate variation before updating, the computing system 4 determines that the largely deviated correction vector is a large displacement having exceptionally been caused, and deletes the stored value of the correction vector from the information storage 55.

On the other hand, in a case where the correction vector newly acquired by performing the sequence 146 of extracting a defect position is not converged within the coordinate variation before updating, the computing system 4 continuously holds the acquired value of the correction vector in the information storage 55 without updating the value of coordinate variation. The allowed number of continuous operations of storing the value of the correction vector without updating the value of coordinate variation may preliminarily be stored in the information storage 55 as a numerical value. When the number of operations of storing the correction vector without updating the value of coordinate variation exceeds the stored numerical value, the computing system 4 determines that the large displacement having been caused indicates that the coordinate system of the defect inspection system or the defect review system has been changed. In this case, the computing system 4 controls the image display 52 to display a warning indicating that the coordinate system has been changed. The computing system 4 corrects the value of coordinate variation acquired by the fine alignment process on the basis of the aforementioned stored correction vector.

This embodiment enables coordinate variation owing to the defect inspection system to be reduced even in observation, and allows a defect as an observation target to be observed with high throughput without being missing from the field of view.

(3) Others

The present invention can also be realized by software program code that realizes the functions of an embodiment. In this case, a storing medium recorded with the program code is provided for a system. A computer (or a CPU or an MPU) of the system reads the program code stored in the storing medium. In this case, the program code itself, which has been read from the storing medium, realizes the aforementioned functions of the embodiment. The program code itself and the storing medium stored with the code configure the present invention. A flexible disk, a CD-ROM, a DVD-ROM, a hard disk, an optical disk, an optical magnetic disk, a CD-R, a magnetic tape, a nonvolatile memory card, a ROM and the like are used as the recording media for providing such program code.

An OS (operating system) operating on the computer according to instructions of the program code may perform some of or all of the actual processes. The functions of the aforementioned embodiments may be realized according to the processes. The program code read from the storing medium may be written on memory of the computer, and subsequently the CPU or the like of the computer performs some of or all of the actual processes, thereby realizing the functions of the aforementioned embodiments according to the processes.

The software program code realizing the functions of the embodiments may be distributed via a network, and thereby stored in a storing section, such as a hard disk and a memory, or a storing medium, such as a CD-RW and a CD-R, of the system. At the point of use, the computer (or the CPU or the MPU) of the system may read and perform the program code stored in the storing section or the storing medium.

REFERENCE SIGNS LIST

1 . . . electron beam column, 2 . . . specimen chamber, 3 . . . power source unit, 4 . . . computing system, 11 . . . primary electron beam, 12 . . . secondary signal, 21 . . . electron source, 22 . . . focusing lens, 23 . . . deflector lens, 24 . . . objective lens, 25 . . . secondary signal detector, 31 . . . specimen, 32 . . . specimen stage, 41 . . . high voltage control power source, 42 . . . focusing lens control power source, 46 . . . stage driving power source, 51 . . . image forming system, 52 . . . image display, 53 . . . input device, 54 . . . transceiver, 55 . . . information storage

The invention claimed is:

1. A defect review system moving a specimen to a coordinate position of a defect detected in a first coordinate system and observing the defect of the specimen in a narrow field of view with respect to a second coordinate system, comprising:
 a displacement measurement section which measures an amount of displacement between the coordinate position of the defect in the first coordinate system and an actual specimen position in the second coordinate system;
 a coordinate correction formula optimizer which optimizes a coordinate correction formula for performing conversion from the second coordinate system to the first coordinate system in a direction of minimizing the measured amount of displacement;
 a variation amount calculator which performs statistical processing on a variation amount of the amount of displacement between the first coordinate system and the second coordinate system;
 a variation amount evaluation section which evaluates the variation amount on the basis of the length of the narrow field of view; and
 a sequence determining section which determines a sequence of a process of squiring a defect image on the basis of an evaluation result by the variation amount evaluation section, wherein
 when the variation amount is smaller than a certain constant-fold product of the length of the narrow field of view, the sequence determining section determines the sequence of the process of acquiring the defect image so as to skip the process of acquiring an image for search for detecting the defect in a wide field of view and to perform a process of acquiring a defect image for observation in the narrow field of view.

2. A defect review system moving a specimen to a the defect of the specimen in a narrow field of view with respect to a second coordinate system, comprising:
 a displacement measurement section which measures an amount of displacement between the coordinate position of the defect in the first coordinate system and an actual specimen position in the second coordinate system;
 a coordinate correction formula optimizer which optimizes a coordinate correction formula for performing conversion from the second coordinate system to the first coordinate system in a direction of minimizing the measured amount of displacement;
 a variation amount calculator which performs statistical processing on a variation amount of the amount of displacement between the first coordinate system and the second coordinate system;
 a variation amount evaluation section which evaluates the variation amount on the basis of the length of the narrow field of view; and
 a sequence determining section which determines a sequence of a process of acquiring a defect image on the basis of an evaluation result by the variation amount evaluation section; wherein
 when the variation amount is larger than a certain constant-fold product of the length of the narrow field of view, the sequence determining section determines the sequence of the process of acquiring the defect image so as to perform a process of acquiring an image for search for detecting the defect in a wide field of view and to perform a process of acquiring, using a result thereof, a defect image for observation in the narrow field of view.

3. The defect review system according to claim 2, further comprising a variation amount updating section which extracts a defect position using the defect image for search acquired in the process of acquiring an image for search, reflects the defect position in the variation amount acquired by the variation amount calculator and thereby updates the variation amount, wherein the sequence determining section determines the sequence of the process of acquiring the defect image using the updated variation amount acquired by the variation amount updating section.

4. The defect review system according to claim 3, wherein when the amount of displacement deviates by at least a prescribed extent from the variation amount, the variation amount updating section prohibits updating of the variation amount.

5. A method of controlling a defect review system comprising a computing system moving a specimen to a coordinate position of a defect detected in a first coordinate system and observing the defect of the specimen in a narrow field of view with respect to a second coordinate system, comprising:

a displacement measurement step in which the computing system measures an amount of displacement between the coordinate position of the defect in the first coordinate system and an actual specimen position in the second coordinate system;

a coordinate correction formula optimization step in which the computing system optimizes a coordinate correction formula for performing conversion from the second coordinate system to the first coordinate system in a direction of minimizing the measured amount of displacement;

a variation amount calculation step in which the computing system performs statistical processing on a variation amount of the amount of displacement between the first coordinate system and the second coordinate system;

a variation amount evaluation step in which the computing system evaluates the variation amount on the basis of the length of the narrow field of view; and a sequence determining step in which the computing system determines a sequence of a process of acquiring a defect image on the basis of an evaluation result by the variation amount evaluation section, wherein when the variation amount is smaller than a certain constant-fold product of the length of the narrow field of view, the sequence determining section the process of acquiring an image for search for detecting the defect in a wide field of view and to perform a process of acquiring a defect image for observation in the narrow field of view, or when the variation amount is larger than a certain constant-fold product of the length of the narrow field of view, the sequence determining section determines the sequence of the process of acquiring the defect image so as to perform a process of acquiring an image for search for detecting the defect in a wide field of view and to perform a process of acquiring, using a result thereof, a defect image for observation in the narrow filed of view.

\* \* \* \* \*